US007888585B2

(12) United States Patent
Lechner et al.

(10) Patent No.: US 7,888,585 B2
(45) Date of Patent: Feb. 15, 2011

(54) PHOTOVOLTAIC MODULE INCLUDING TAP CELLS AND METHOD OF MAKING

(75) Inventors: Peter Lechner, Vaterstetten (DE); Walter Psyk, Munich (DE); Erwin Heckel, Au in der Hallertau (DE)

(73) Assignee: SCHOTT Solar GmbH, Alzenau (DE)

( * ) Notice: Subject to any disclaimer, the term of this patent is extended or adjusted under 35 U.S.C. 154(b) by 488 days.

(21) Appl. No.: 11/998,156

(22) Filed: Nov. 28, 2007

(65) Prior Publication Data

US 2008/0142070 A1    Jun. 19, 2008

(30) Foreign Application Priority Data

Dec. 6, 2006  (DE) .................... 10 2006 057 454

(51) Int. Cl.
*H01L 31/0224* (2006.01)
*H01L 31/05* (2006.01)
*H01L 21/263* (2006.01)
*H01L 21/28* (2006.01)

(52) U.S. Cl. .................... 136/244; 136/256; 438/98
(58) Field of Classification Search ......... 136/243–265; 438/57–98
See application file for complete search history.

(56) References Cited

U.S. PATENT DOCUMENTS 4,562,637 A * 1/1986 Kushima et al. ....... 219/121.64
5,794,839 A * 8/1998 Kimura et al. ........... 228/123.1

FOREIGN PATENT DOCUMENTS

| DE | 199 34 560 A1 | 2/2001 |
| DE | 101 09 643 A1 | 9/2002 |
| JP | 2005-353767 A | 12/2005 |

OTHER PUBLICATIONS

Manders et al. "Lead/acid battery design and operation". Journal of Power Sources, 73, p. 152-161, 1998.*

* cited by examiner

*Primary Examiner*—Basia Ridley
*Assistant Examiner*—Christina Chern
(74) *Attorney, Agent, or Firm*—Flynn, Thiel, Boutell & Tanis, P.C.

(57) ABSTRACT

A photovoltaic module includes a plurality of interconnected submodules. Each submodule has a transparent front electrode layer, a semiconductor layer and a back electrode layer which have separating lines in each case for forming series-connected strip-shaped photovoltaic cells. The outer cells of two adjacent submodules are united into a single tap cell for current collection, the separating lines of the two adjacent submodules being disposed mirror-symmetrically with respect to their common tap cell.

20 Claims, 4 Drawing Sheets

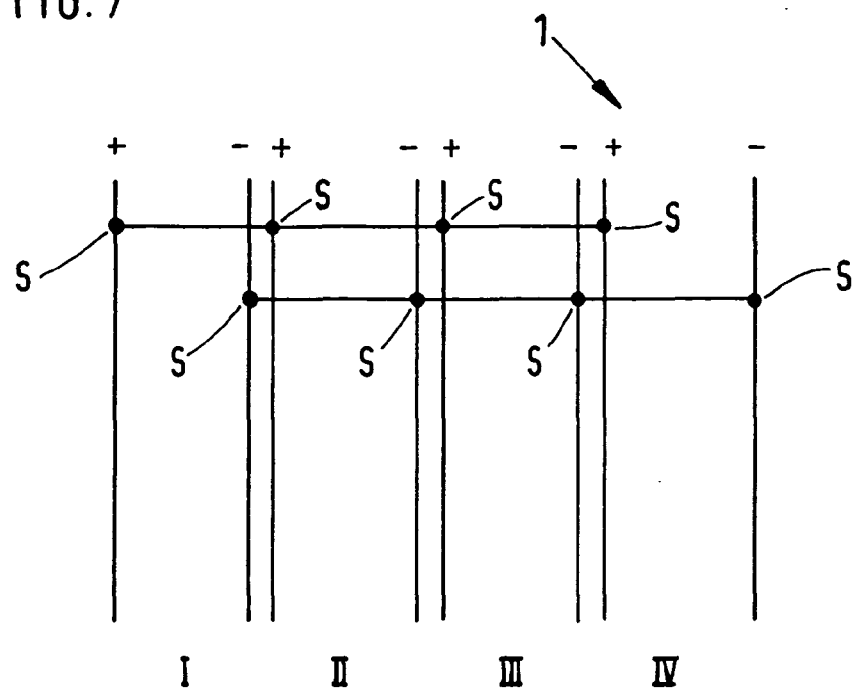
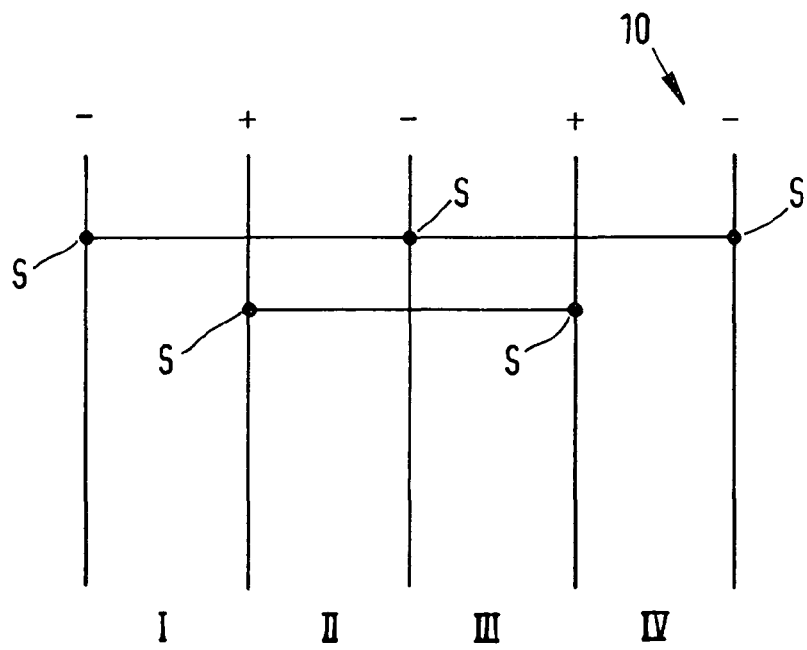

PHOTOVOLTAIC MODULE INCLUDING TAP CELLS AND METHOD OF MAKING

This invention relates to a photovoltaic module according to the preamble of claim 1. It also relates to a method for producing said module.

In the production of photovoltaic thin-film modules, an electrically insulating substrate, such as a glass plate, is generally coated over a large area with a transparent front electrode layer, a semiconductor layer and a back electrode layer. Upon deposition of each layer a structuring step is carried out. That is, the layers are successively separated into strips e.g. by laser, mechanically or chemically, the separating lines extending so that the resulting strip-shaped photovoltaic cells are series-connected by overlapping of areas of the front electrode layer and the back electrode layer.

The optimal width of the strip-shaped cells is determined by the sheet resistance of the front electrode layer and the back electrode layer as well as the impedance of the cell upon illumination. In a power-optimized module the cell widths are typically, depending on the thin-film technology, approximately 4-10 millimeters for simple thin-film cells, i.e. cells with only one p-n junction, e.g. with a semiconductor layer of silicon, in particular amorphous (a-Si) or microcrystalline (μc-Si) silicon or of copper-indium- or copper-indium-gallium-sulfide and/or -selenide or of cadmium telluride, while for thin-film silicon stacked cells, that is, cells with multiple p-n junctions, e.g. a-Si/a-Si and a-Si/μc-Si tandem or also triple cells, the cell width is usually 7 to 20 millimeters. The technology-dependent open-circuit and operating point voltage and the optimal cell width result for thin-film technologies in a specific open-circuit voltage of about 100 volts per meter of substrate dimension, that is, for a module comprising series-connected strip-shaped cells and having a width of one meter. In a module with a typical characteristic, the operating point voltage is about 75-85% of the open-circuit voltage. With an increasing substrate dimension, the module voltage thus increases at the same time.

For certain applications, however, a low voltage is desirable, for example upon use of photovoltaic modules in 12 volt battery systems. A low module voltage is often also preferred in grid-connected systems. It is thereby possible to connect substantially more modules in a string in series up to the permissible system voltage. Typical thin-film modules have a specific power of 1-2 watts per volt of open-circuit voltage. At a permissible system voltage for the module of e.g. 600 volts, this results in a maximum possible power per string of 600-1200 watts. Modules with a crystalline semiconductor layer, in contrast, achieve 5 to 10 watts per volt of module voltage, resulting in a considerably higher power per string, or resulting in fewer strings for a given power of a photovoltaic module, which leads to substantial cost savings.

Figure 1:
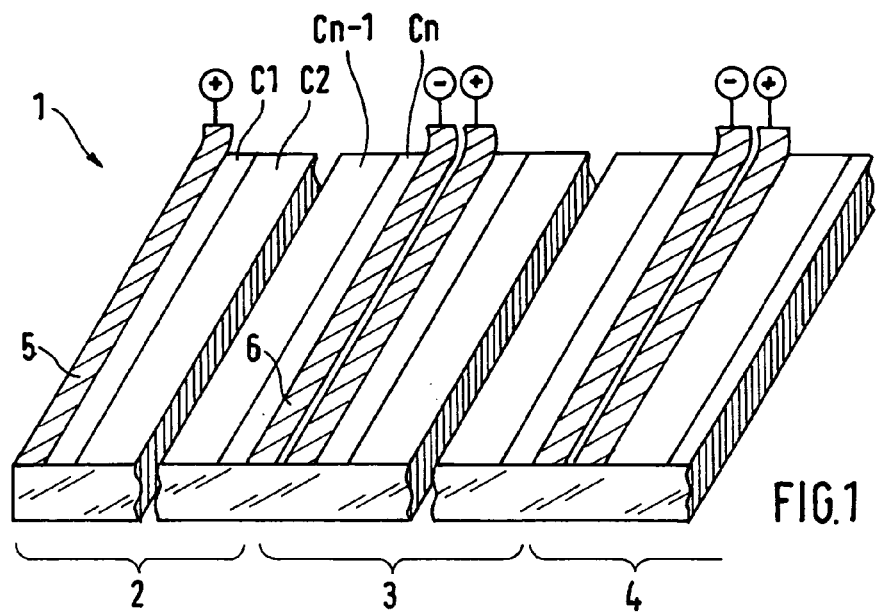

To lower the voltage of a photovoltaic module it is known, as shown in FIG. 1, to subdivide the module 1 into a plurality of equally large submodules 2, 3, 4 with accordingly low voltage which are connected in parallel via an external connection.

As illustrated by the submodule 2 in FIG. 1, each submodule comprises a plurality of cells, i.e. the first and second cells C1, C2 shown, the second last and last cells Cn−1 and Cn shown, and the cells located therebetween not shown. The two outer cells, that is, the first and last cells C1 and Cn, are configured in each case as tap cells or terminals for current collection and provided for this purpose with contact strips 5, 6. The cells located therebetween have in each case the same area, i.e. the same width since they are equally long. Of the tap cells, that is, the two outer cells of each submodule, at least one is photovoltaically inactive, i.e. it does not contribute to power generation. Thus a low module voltage can be obtained with the module 1 according to FIG. 1, but the numerous tap cells lead to a reduction of the photoactively utilized area and thus of the module power.

It is the problem of the invention to provide a module with low voltage but high power.

This is obtained according to the invention by the photovoltaic module characterized in claim 1. Preferred embodiments of the invention are rendered in claims 2-4. Claim 5 relates to a preferred method for producing the module, which is advantageously refined by claims 6 and 7.

According to the invention, the outer cells of two adjacent submodules are united into a common tap cell. At the same time, the separating or connection lines of the two adjacent submodules are disposed mirror-symmetrically with respect to the common tap cell.

Combining the outer tap cells of two adjacent mirror-symmetric submodules into a single tap cell means that according to the invention considerably fewer tap cells are needed that reduce the power of the module. That is, instead of four tap cells as required in a module comprising two submodules according to the prior art, only three tap cells are needed according to the invention, and for example in a module comprising four submodules only five tap cells are needed as opposed to eight tap cells according to the prior art.

The tap cells can be photovoltaically inactive and thus effective only as a terminal, or be photoactive and provided with a current collector.

The symmetry plane for the mirror-symmetric arrangement of the separating or connection lines in the individual layers, i.e. the front electrode layer, semiconductor layer and back electrode layer, extends in the perpendicular bisector of the tap cells between the two mutually adjacent submodules.

Thus, the two adjacent submodules have according to the invention a common first cell which is followed on both sides by the second, third, etc., up to the last cell of one or the other submodule. It is thus possible according to the invention to combine the photovoltaically inactive tap cells of two adjacent, mirrored submodules. According to the invention this saves the area of one photovoltaically inactive tap cell, as well as one contact strip.

Further, the photoactive tap cells of two adjacent, mirrored submodules can be disposed beside each other. This obtains a further area saving through the omission of the separating lines between the adjacent submodules. One contact strip is additionally saved.

The submodules of the inventive module are connected in parallel for example via an external connection. To optimally realize the advantages of the invention, the module preferably comprises an even number of submodules, preferably at least four submodules. The area of the cells between the tap cells of each submodule is equally large. That is, with the cells having the same length the cells between the tap cells have the same width. The photoactive tap cells can possess the same area or width as the cells located therebetween, but, as explained more precisely hereinafter, also be configured with a larger area or wider being photoactive cells. If the tap cell is configured to be photovoltaically inactive, however, it can also be narrower than the other cells, being preferably approximately as wide as the contact strip.

The transparent front electrode layer which faces the incident light can be e.g. a TCO (transparent conductive oxide) layer, for example zinc oxide or tin oxide. It can e.g. be applied to a glass plate as the substrate. The semiconductor layer of the inventive module can consist for example of silicon, for example a-Si or μC-Si or of copper-indium- or copper-indium-gallium-sulfide and/or -selenide or of cadmium telluride. If a simple cell, i.e. a semiconductor layer with only one p-n junction, is used, the width of a cell can be about 3-15 millimeters, in particular 4-10 millimeters. For thin-film silicon stacked cells, for example a-Si/a-Si or a-Si/ μc-Si tandem or also triple cells, that is, with a semiconductor layer with two, three or more p-n junctions, the width of the cells is preferably 5-30, in particular 7-20, millimeters. The efficiency decreases with increasing strip width. On the other hand, the area loss has an adverse effect due to the larger number of connection or separating lines in case of a smaller strip width.

The back electrode layer can be formed by a metal layer or an electroconductive metal oxide layer, optionally also consisting of TCO.

The front electrode layer, the semiconductor layer and the back electrode layer are generally applied by chemical and/or physical vapor deposition. The connection or separating lines in the individual layers can be formed by a laser or mechanically or chemically, for example by etching.

The inventive module can be employed at low voltages, for example in battery systems, for example 12 volt battery systems. It is also applicable in grid-connected systems, whereby a plurality of modules can be connected in a string in series up to the permissible system voltage.

It is preferable to use the superstrate technology for the inventive module, i.e. to contact the tap cells on the back electrode, that is, on the side of the semiconductor layer facing away from the irradiation side.

If the tap cell is executed so as to be photoactive, it is preferable to employ a contacting method by which the photoactivity is in particular not destroyed by an electrical short circuit, but in any case largely maintained. The back electrode layer of the cell constituting the tap cell can be provided for this purpose with a bonding, electroconductive paste to which a metallic contact strip is applied. The paste can be e.g. filled with silver. A thermally activatable adhesive can also be used.

Moreover, it is possible to use a self-adhesive contact strip, for example with an adhesive layer based on acrylic/silicone or rubber, which can be filled with conductive particles, such as small metal balls or metallized ceramic or metal balls. It is also possible to use a contact strip that is so embossed that its raised areas are in direct contact with the back electrode layer while the recessed areas are configured to be non-electroconductive and are filled with an adhesive, thus ensuring adhesion of the contact strip to the tap cell. Thermal activation is then generally unnecessary.

Soldering processes can also be employed for nondestructive contacting of the photoactive cell. For soldering processes based on tin solder to be usable, however, the cell must be provided with a solderable metal layer, for example with a tin, silver or copper layer. A nickel layer can also be used, since it forms a diffusion barrier for tin, silver and copper and protects the cell particularly well from a diffusion of said metals out of the solder during the soldering process and in later operation of the photovoltaic module. The nickel layer can be e.g. ten nanometers to 1 micron. The soldering process itself can be carried out with a soldering iron either manually or automatically.

The soldering point can, for contactless thermal activation, be irradiated momentarily with short-wave light, for example a halogen lamp or by a laser beam. A further contactless soldering process is the application of high frequency energy momentarily coupled inductively into the contact strip. It is important here that substantially the metallic contact strip is heated by the absorbed high frequency energy, but not the much thinner back electrode layer.

An essential requirement for obtaining a long-term stable soldered connection is the chemical activation of the two surfaces to be connected. A pre-tinned metallic contact strip is suitable for this purpose. The surface of the photoactive cell can also be tinned locally. Instead of tinning, a flux can also be applied locally to the cell at the later soldering point. Further, a pre-tinned contact strip treated with flux can be used for chemical activation of the surface to be soldered.

Instead of a contact strip, the tap cell can also have a tinning in the form of a conductor track having a cross section similar to a contact strip.

If the contacting impairs the photoactivity of the tap cells, it has proved to be especially advantageous to use, for contacting, areas of the tap cells that are separated by separating lines to thereby retain the photoactivity of the tap cells outside said areas.

The photoactive area of the tap cell must then be equally large as the area of the cells between the tap cells, however. That is, the tap cell has altogether a larger area, i.e. a greater width when the length is the same, in order to compensate the separated areas intended for contacting.

The contacting in said areas can be effected for example by soldering, welding processes, such as ultrasonic welding, and the like. It is true that the photoactivity of the tap cells can then be lost in said areas. Said isolated areas are preferably selected in their size so that the photoactivity of the tap cells is substantially retained. For this purpose, said areas can be disposed for example at a distance of 10-300 millimeters and possess an area of for example 5-50 square millimeters to be contacted with a contact strip without damaging the photoactive cell outside said areas.

The separating lines for the isolated areas can be formed during the manufacturing process in the course of the structuring, i.e. the production of the separating lines for the connection of the cells, i.e. for example by laser, mechanically or chemically. For this purpose, the transparent front electrode layer is preferably provided with said small electrically separated areas.

The contact strips are preferably connected to the back electrode layer in the separated areas by soldering according to the invention. The contact strips are preferably pre-tinned and provided with a flux. Soldering can be effected by application of high frequency energy coupled inductively into the contact strip.

The back electrode layer can also comprise a plurality of single layers, the outermost single layer being formed by a metal layer which constitutes a diffusion barrier upon soldering to the pre-tinned contact strip provided with the flux. For example, the back electrode layer can comprise a tin oxide layer with a thickness of e.g. 80 nm, an aluminum layer with a thickness of for example 250 nm, and a nickel layer as a diffusion barrier with a thickness of 10 nm to 1 μm, preferably 50 to 100 nm as the outermost single layer. The inductively coupled high frequency used for soldering can be for example 100 kHz to 2 MHz.

Figure 2:
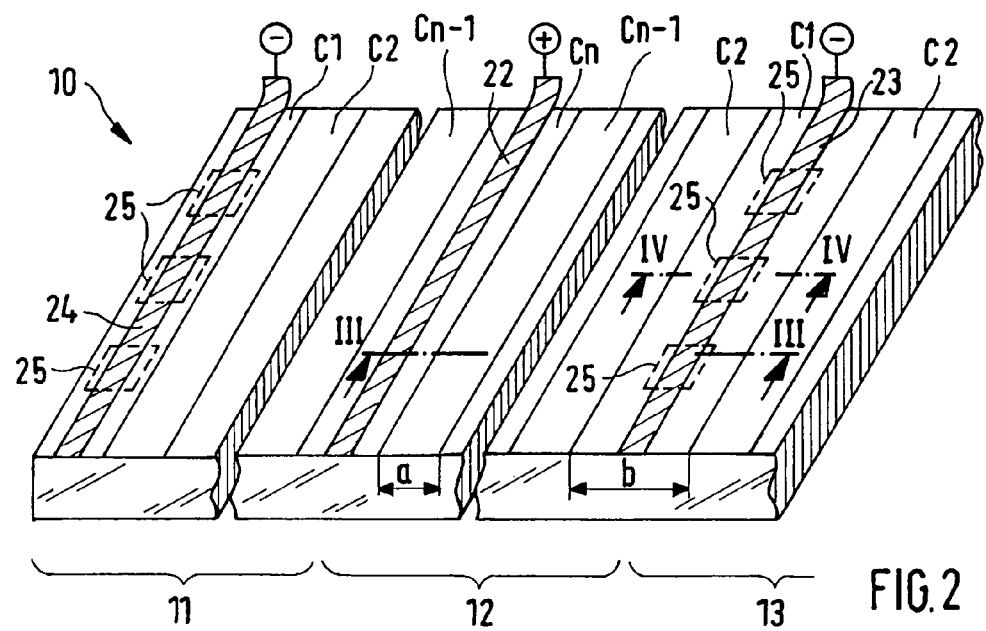
Figure 3:
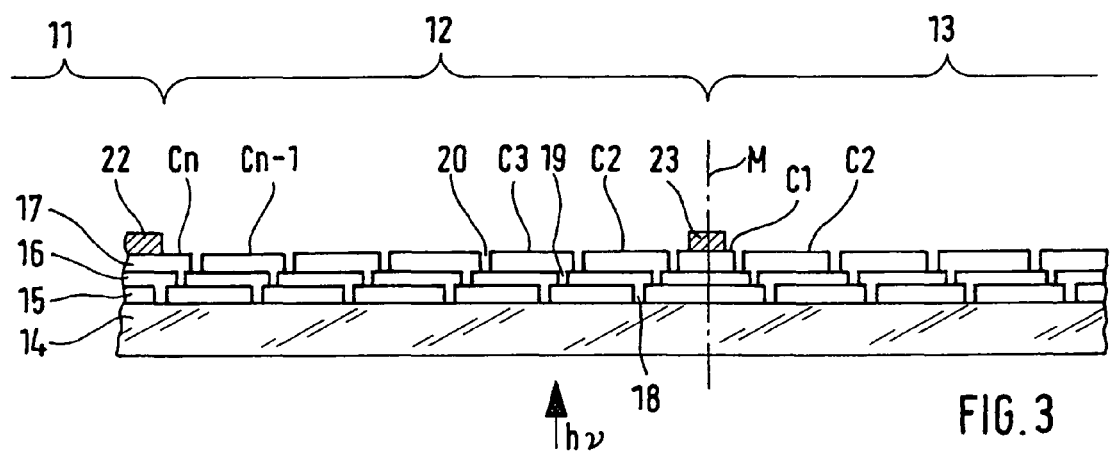
Figure 4:
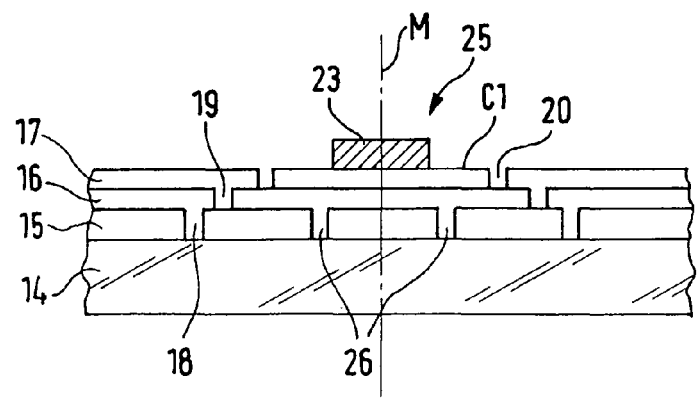
Figure 5:
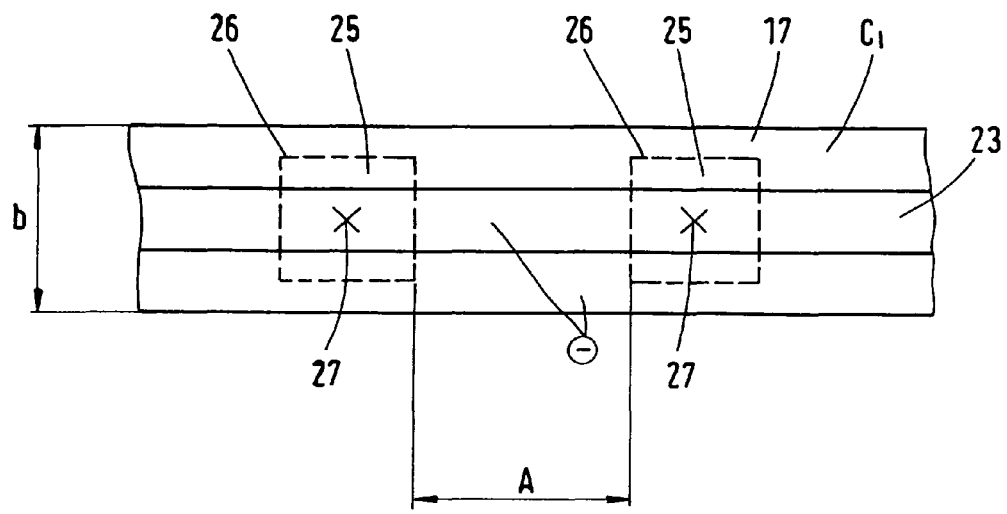
Figure 6:
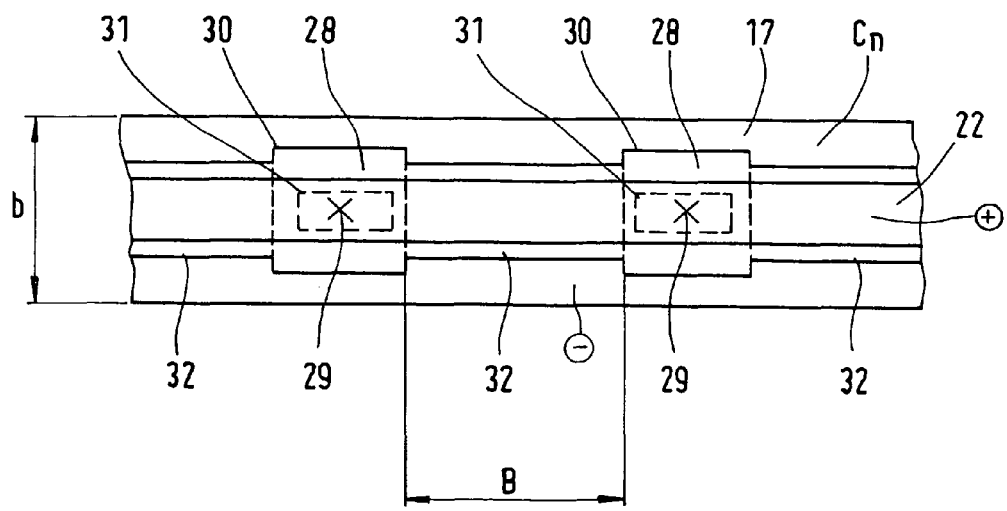

The attached drawing shows:

FIG. 1 a photovoltaic module according to the prior art in a perspective, partial view;

FIG. 2 an example of an embodiment of the inventive photovoltaic module in a perspective, partial view;

FIGS. 3 and 4 sections through the module according to FIG. 2 along lines III-III and IV-IV;

FIGS. 5 and 6 plan views of photoactive tap cells with an isolated negative or positive pole; and FIGS. 7 and 8 the connections of modules with four submodules according to the prior art and according to the invention.

According to FIG. 2 the photovoltaic module 10 comprises a plurality of submodules 11, 12, 13.

For this purpose, according to FIG. 3, there are applied e.g. by vapor deposition to a transparent substrate 14, for example a glass plate, on the side of incident light (hv) of the module a transparent front electrode layer 15, a semiconductor layer 16 and a back electrode layer 17. The individual layers are provided in each case with separating lines e.g. by a laser, the front electrode layer 15 with the separating lines 18, the semiconductor layer 16 with the separating lines 19, and the back electrode layer 17 with the separating lines 20. This causes the front electrode layer 15 and the back electrode layer 17 to overlap, thereby forming series-connected strip-shaped photovoltaic cells C.

The two outer cells of the two adjacent submodules 11 and 12 or 12 and 13 are united here into one tap cell. That is, the tap cell with the positive pole at the same time constitutes the last cell Cn of the submodule 11 and the last cell Cn of the adjacent submodule 12, while the tap cell with the negative pole at the same time constitutes the first cell C1 of the submodule 12 and the first cell C1 of the adjacent submodule 13.

All cells C have the same length. The cells C2 to Cn−1 between the tap cells C1, Cn have the same width a. The tap cell C1 with the negative pole at the outer edge of the submodule 11 and thus of the module 10 has the same width a as the cells C2 to Cn−1.

The common photovoltaically inactive tap cell Cn with the positive pole has a smaller width than a. The width of the contact strip is typically the same as of the cells C2 to Cn−1 with the width a.

In contrast, the common photovoltaically active tap cell with the negative pole between the submodules 12 and 13 has the width b which corresponds to twice the width a of the other cells, plus optionally an additional width for compensating the photovoltaically inactive areas 25 for contacting the contact strip 23, as explained more precisely hereinafter. The cell C1 in question constitutes the photoactive tap cell for the adjacent submodules 12 and 13. In this way a further area saving is obtained by the omission of separating lines between the two submodules 12, 13. Also, only the one contact strip 23 is required for contacting.

Thus, according to FIG. 3 the separating lines 18, 19 and 20 of the two adjacent submodules 12 and 13 are disposed mirror-symmetrically with respect to each other, the symmetry plane extending through the perpendicular bisector M. The two adjacent submodules 11 and 12 have the same mirror symmetry.

That is, the two submodules 12 and 13 have a common first cell C1 which is followed on both sides mirror-symmetrically by the second cell C2, the third cell C3, etc., up to the last cell Cn, while the two submodules 11 and 12 have the last cell Cn in common which is followed on both sides by the second last cell Cn−1, etc., up to the first cell C1 of said two submodules 11 and 12.

The tap cells Cn and C1 are provided for current removal with contact strips 22, 23, and likewise the first cell C1 of the submodule 11, which completes the module 10 on this side, with a contact strip 24.

The negative poles and the positive poles of the submodules 11, 12, 13 of the module 10 are connected in parallel for example via an external connection. FIG. 7 shows the connection of a known module 1 with four submodules I, II, III and IV, and FIG. 8 that of a module 10 with four submodules I, II, III and IV according to the invention, the soldered connections being marked by "S".

As FIGS. 7 and 8 show, the number of soldered connections S is also reduced according to the invention in accordance with the reduced number of tap cells, in the shown example of a module with four submodules I-IV from eight (FIG. 7) to five (FIG. 8).

The separating lines 18, 19 and 20 can also be disposed differently than shown in FIGS. 3 and 4. For example, the separating line 20 can divide up both the back electrode 17 and the semiconductor layer 16.

As indicated in FIG. 2 by the tap cell C1 with the negative pole, said cell can have areas 25 shown by dashed lines which are formed by separating lines 26 in the front electrode layer 15, as apparent from FIG. 4. The contact strip 23, 24 is connected, for example soldered, to the tap cell C1 at the areas 25. Although the tap cell C1 becomes photoinactive in the areas 25 through the soldering, its photoactivity remains unimpaired outside the areas 25.

FIG. 5 shows an enlarged plan view of the tap cell C1 with the negative pole according to FIGS. 2 to 4. FIG. 5 indicates that in the middle of the area 25 the contact strip 23 is connected to the back electrode layer 17 at 27 e.g. by soldering and thus with destruction, or at least impairment, of photoactivity in the area 25. The areas 25 lost for photoactivity are compensated by a corresponding enlargement of the width b of the tap cell C1.

FIG. 6 shows an embodiment of a photoactive tap cell Cn with the positive pole in an enlarged plan view. Here the contact strip 22 is connected to the back electrode 17 at 29 in the middle of the areas 28 e.g. by soldering in the areas 28. The separating lines 30 which form the areas 28 are provided in the back electrode 17 or alternatively in the back electrode 17 and the semiconductor layer 16 in order to isolate the areas 28 from the surrounding, negatively poled tap cell. Moreover, within each area 28 separating lines 31 are provided in the semiconductor layer 16 in order to switch the potential of the front electrode 15 to the back electrode area 28. The positive potential of the front electrode 15 is thus supplied to the separated back electrode area 28. To prevent the positively poled contact strip 22 from coming in contact with the negatively poled back electrode 17 outside the areas 28, an insulating layer 32 e.g. in the form of an adhesive insulating tape is disposed between the contact strips 22 and the back electrode 17 between the areas 28 in each case.

While the distance A between the areas 26 according to FIG. 5 preferably corresponds to one to ten times, in particular three to six times, the width of the tap cell C1, the distance B between the areas 28 according to FIG. 6 is preferably 0.5 to two times the width of the tap cell Cn.

The invention claimed is:

1. A photovoltaic module comprising interconnected submodules with a transparent front electrode layer, a semiconductor layer and a back electrode layer
    which have separating lines in each case for forming series-connected strip-shaped photovoltaic cells, the two outer cells of each submodule constituting tap cells for current collection, the adjacent outer cells of two adjacent submodules form a single common tap cell, the separating lines of the two adjacent submodules being disposed mirror-symmetrically with respect to the common tap cell, and the tap cells being contacted on the back electrode layer with contact strips for current output,
    wherein the tap cells each have at least two spaced contact areas separated by separating lines for current collection while maintaining the photoactivity outside said spaced contact areas,
    wherein for a tap cell with a negative pole, the separating lines are provided in the front electrode layer, wherein for a tap cell with a positive pole, the separating lines are provided in the back electrode layer or in the back electrode layer and semiconductor layer, and wherein the semiconductor layer includes at least one additional separating line within each of the spaced contact areas for current collection of the tap cell having a positive pole, and the corresponding contact strip for current output is isolated electrically from the back electrode outside the spaced contact areas.

2. The photovoltaic module according to claim 1, wherein said module comprises an even number of submodules.

3. The photovoltaic module according to claim 1, wherein the contact strips are connected to the back electrode layer in the spaced contact areas of each of the tap cells by soldering.

4. The photovoltaic module according to claim 3, wherein the tap cells include a diffusion barrier for joining to metals of a solder.

5. A method for producing a photovoltaic module according to claim 1, wherein the contact strips are connected to the back electrode layer in the spaced contact areas of each of the tap cells by soldering.

6. The method according to claim 5, wherein the contact strips are pre-tinned and provided with a flux.

7. The method according to claim 5, wherein soldering is effected by application of high frequency energy coupled inductively into the contact strip.

8. The photovoltaic module according to claim 1, including an insulating layer disposed between the contact strip and the back electrode of the tap cells having a positive pole, except for the spaced contact areas provided for current collection.

9. The photovoltaic module according to claim 1, wherein each of the separate spaced contact areas of each of the tap cells possess an area from 5 square millimeters to 50 square millimeters for contact with a respective contact strip.

10. The photovoltaic module according to claim 1, wherein the distance between the spaced contact areas of the tap cell having a negative pole is one to ten times the width of the tap cell having a negative pole.

11. The photovoltaic module according to claim 10, wherein the distance between the spaced contact areas is three to six times the width of the tap cell having a negative pole.

12. The photovoltaic module according to claim 1, wherein the distance between the spaced contact areas of the tap cell having a positive pole is 0.5 to two times the width of the tap cell having a positive pole.

13. The photovoltaic module according to claim 1, wherein photoactivity is maintained in a space between the spaced contact areas of the tap cells.

14. The photovoltaic module according to claim 1, wherein the spaced contact areas are surrounded by separating lines.

15. A photovoltaic module comprising interconnected elongate submodules, each said elongate submodule comprising a transparent front electrode layer, a semiconductor layer and a back electrode layer, each said submodule including elongate outer cells formed by separating lines and opposing outer side edges thereof, wherein an outer side edge of an outer cell of a first submodule is configured to contact an outer side edge of an outer cell of an adjacent second submodule to form a series-connected-strip-shaped photoactive tap cell having a negative pole, and wherein an opposing outer side edge of an opposing outer cell of the first said submodule is configured to contact an outer side edge of an outer cell of an adjacent third submodule to form a series-connected-strip-shaped photoactive tap cell having a positive pole, said photoactive tap cell having a negative pole including first and second separate spaced contact areas for collecting current, the first and second separate spaced contact areas being enclosed by separating lines configured to form shapes of the respective first and second contact areas, a first contact strip for outputting current, the first contact strip extending the length of the photoactive tap cell having a negative pole and being in electrical contact with the first and second separate spaced contact areas, wherein the photoactive tap cell having a negative pole is not photoactive in the first and second separate spaced contact areas and is photoactive in the remaining areas thereof, said photoactive tap cell having a positive pole including third and fourth separate spaced contact areas for collecting current, the third and fourth separate spaced contact areas being enclosed by separating lines provided in the back electrode layer or in the back electrode layer and the semiconductor layer, the additional separating lines configured to form shapes of the third and fourth separate spaced contact areas, and a second contact strip for outputting current, the second contact strip extending the length of the photoactive tap cell having a positive pole and being in electrical contact with the third and fourth spaced contact areas, wherein the photoactive tap cell having a positive pole is not photoactive in the third and fourth spaced contact areas and is photoactive in the remaining areas thereof.

16. The photovoltaic module according to claim 15, including providing separating lines in the semiconductor layer of the third and fourth spaced contact areas of the photoactive tap cell having a positive pole in order to switch the potential of the front electrode layer to the back electrode layer.

17. The photovoltaic module according to claim 16, including providing an insulating layer disposed between the back electrode layer of the photoactive tap cell having a positive pole and the second contact strip in the photoactive areas between the third and fourth spaced contact areas.

18. The photovoltaic module according to claim 15, wherein the first and second spaced contact areas of the photoactive tap cell having a negative pole each possess an area from 5 square millimeters to 50 square millimeters for contact with the first contact strip.

19. The photovoltaic module according to claim 15, wherein the distance between the first and second spaced contact areas is one to ten times the width of the photoactive tap cell having a negative pole.

20. The photovoltaic module according to claim 15, wherein the distance between the third and fourth separate spaced contact areas is 0.5 to two times the width of the photoactive tap cell having a positive pole.

* * * * *